United States Patent
Lin et al.

(10) Patent No.: US 7,362,122 B2
(45) Date of Patent: Apr. 22, 2008

(54) METHOD AND CIRCUIT FOR EXTRACTING CURRENT-VOLTAGE CHARACTERISTICS OF DEVICE

(75) Inventors: Wei-Cheng Lin, Hsinchu (TW); Kuo-Pei Lu, Hsinchu (TW); Yao-Wen Chang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/178,167

(22) Filed: Jul. 8, 2005

(65) Prior Publication Data

US 2007/0007931 A1    Jan. 11, 2007

(51) Int. Cl.
*G01R 31/26* (2006.01)
(52) U.S. Cl. .................. 324/769; 324/76.23; 327/172; 327/513
(58) Field of Classification Search ................. 320/31, 320/39, 40, 43, 48, 22–24, 32; 324/426, 324/224, 760, 685, 721, 670, 769, 76.23; 327/512, 513, 172, 176; 363/95, 78, 79
See application file for complete search history.

(56) References Cited

U.S. PATENT DOCUMENTS 5,905,384 A * 5/1999 Inoue et al. ................. 324/769
6,700,807 B1 * 3/2004 Williams et al. .............. 363/95

OTHER PUBLICATIONS

"Measurement of I-V Curves of Silicon-on-Insulator (SOI) MOSFET's Without Self-Heating" by Author K.A. Jenkins and J.Y.C. Sun / IEEE Electron Device Letters, vol. 16, No. 4, Apr. 1995/p. 145-147.

* cited by examiner

*Primary Examiner*—Rajnikant B. Patel
(74) *Attorney, Agent, or Firm*—J. C. Patents

(57) ABSTRACT

A method and a circuit for extracting current-voltage characteristics employ two pulse signals with different duty cycles into a device to be measured in order to extracting current-voltage characteristics of the device to be measured. The present invention may reduce the self-heating effect of the device to be measured and increase the measurable range of the device to be measured.

9 Claims, 5 Drawing Sheets

METHOD AND CIRCUIT FOR EXTRACTING CURRENT-VOLTAGE CHARACTERISTICS OF DEVICE

BACKGROUND OF THE INVENTION

1. Field of Invention

The present invention relates to the measuring method and circuit for electrical characteristics, and in particular to the measuring method and circuit for, current-voltage characteristics.

2. Description of Related Art

Conventionally, the measurement of the device parameters under the static bias is affected by the factors of self-heating effect, causing a difference between the measured result and the ideal value. The self-heating effect is a phenomenon that the device current decreases due to the decrease of mobility of electrons in the device when the device temperature rises. Particularly, the self-heating effect is more obvious for the high bias or high power devices such as Laterally Diffused Metal Oxide Semiconductor (LD-MOS) devices and Silicon On Insulator (SOI) devices.

As an example to illustrate the self-heating effect conveniently, all the to-be-measured devices in the following drawings are N-channel Metal Oxide Semiconductor (NMOS) transistor. FIG. 1 is a characteristic curve for drain current versus drain-source voltage of the transistor with/without self-heating effect. It is evident that the self-heating effect causes the decrease of drain current.

FIG. 2A is a circuit drawing, schematically illustrating a conventional measuring circuit for the current-voltage characteristics of transistor. The measuring process is first, applying a constant voltage $V_{IN}$ to the gate of the transistor 201. Next, by changing the voltage of power source $V_{DD}$ and measuring the voltage $V_{OUT}$ between the drain and the source, the drain current Id=(VDD−Vout)/R can be calculated out. Thus, the characteristic curve for the drain current versus the drain-source voltage Vout under the applying the gate voltage can be obtained. The shortcoming of this method is that the self-heating effect causes the drain current to decrease for the high power circuit.

In order to reduce the self-heating effect, the disclosure in EEE Electron Device Letters Vol. 16 No. 4 pp. 145-147 has provided an equivalent circuit to the circuit of FIG. 2A of the measuring circuit for measuring the current-voltage characteristic curve of a transistor except that the clock signal as shown in FIG. 2B is instead of a static voltage applied to the gate. The measuring process is first applying a clock signal Vin to the gate of transistor 201. Next, by changing the voltage of the power source VDD and measuring drain-source voltage Vout, then the drain current Id=(VDD−Vout)/R can be calculated to obtain the characteristics curve of drain current versus drain-source voltage under the gate voltage Vg. In order to obtain the intended precision for the current, the resistance R should be large in selection. In above measuring process, even though the temperature gradually rises due to the transistor being at high bias when the clock signal is at the high voltage level (HI), the temperature gradually decreases due to the transistor being at the off state by the clock signal at the low voltage level. Therefore, it is possible to reduce the self-heating effect by a proper duty cycle, which is the ratio of the quantity of time of the clock signal HI to the quantity of time of the clock period T, since the heat accumulation on the transistor is not as fast as the prompt change of clock signal. A shortcoming of above measuring method is that a breakdown may occur on the transistor. For example, in order to let the Vout be the maximum operation voltage od the transistor, VDD=Vout+Id*R. When the clock signal is al low voltage level (LO), the drain electrode has the VDD=Vout+Id*R, then it cause the breakdown on the junction between the drain electrode and the substrate.

SUMMARY OF THE INVENTION

An aspect of the present invention is to provide a measuring method for the current-voltage characteristics, to measure the current-voltage characteristics of a device to be measured. As a result, the self-heating effect can be reduced and the measurable range of the device to be measured can increase.

Another aspect of the present invention is to provide a measuring circuit for the current-voltage characteristics, used to measure the current-voltage characteristics of a device to be measured. By means of such a circuit, the self-heating effect is reduced and the measurable range of the device to be measured increases.

The present invention provides a measuring circuit for the current-voltage characteristics to measure the current-voltage characteristics of a device to be measured comprises following steps. First, a first voltage and a first clock signal are applied to the device to be measured, wherein the first clock signal has a first duty cycle, wherein a first current value is obtained for the device to be measured. Then, the first voltage and a second clock signal are applied to the device to be measured, wherein the second clock signal has second duty cycle, different from the first duty cycle, and a second current is obtained on the measured device. Then, the first current, the second current, the first duty cycle, the second duty cycle, and the period of the clock signal are used for calculation, so as to obtain the expected current on the measured device when the first voltage is applied.

In accordance with the preferred embodiment of the present invention about the measuring method for the current-voltage characteristics, when I1 represents the first current, I2 represents the second current, W1/T represents the first duty cycle, and W2/T represents the second duty cycle, the expected current is Io=(I2−I1)/(W2−W1), in which W1, W2, and T are real number. In addition, the foregoing device to be measured can be a transistor device.

The present invention also provides a measuring circuit for current-voltage characteristics, used to measure the current-voltage characteristic of a device to be measured. This measuring circuit comprises a clock signal generator and a voltage generator. The clock signal generator is coupled to the device to be measured, also called measured device, to generate a first clock signals and a second clock signal, at different time so as to drive the measured device. The first clock signal has a first duty cycle, and the second clock signal has a second duty cycle, and the first duty cycle is different from the second duty cycle. The voltage generator is coupled to the measured device, for setting and applying a voltage to the measured device. In the measuring process, when the measured device is driven by the first clock signal, the first current is generated due to the first voltage and the first clock signal. Also and, when the measured device is driven by the second clock signal the second current is generated due to the first voltage and the second clock signal. The expected current of the measured device can be obtained by means of calculation based on the first current, the second current, the first duty cycle, the second duty cycle, and period of the clock/ signal. Moreover, the aforesaid measured device includes a transistor device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
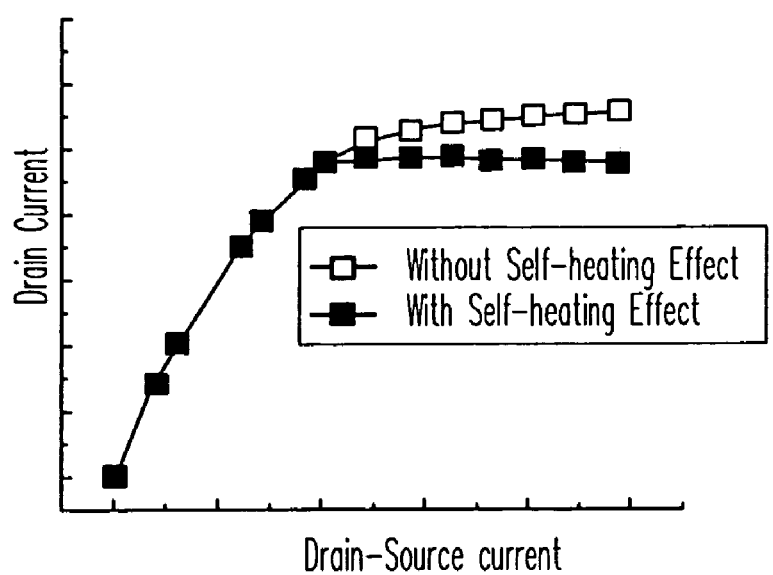
FIG. 1 is a drawing, schematically illustrating a characteristic curve for drain current versus drain-source voltage of the transistor with/without self-heating effect.
Figure 2A:
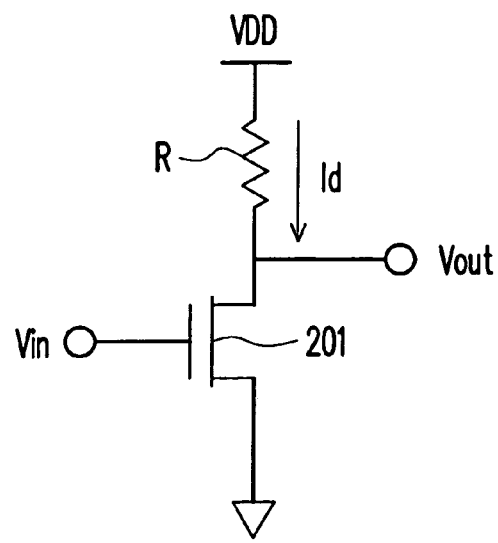
FIGS. 2A-2B are a circuit diagram and a clock signal drawing, schematically illustrating a measuring circuit for the current-voltage characteristics of transistor and the clock signals.
Figure 2B:
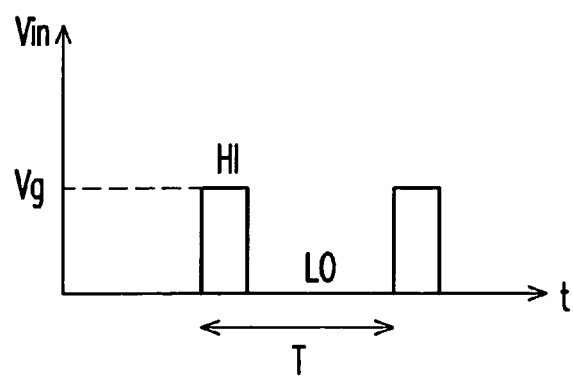
Figure 3A:
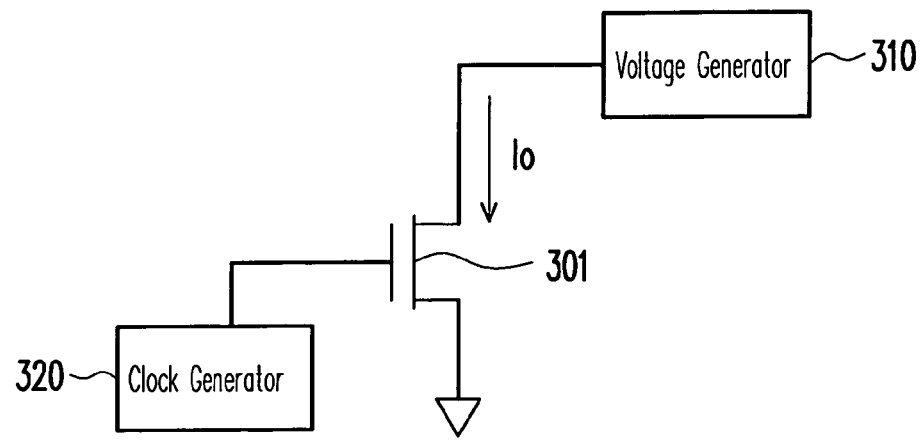
FIGS. 3A-3B are a circuit diagram and a clock signal drawing, schematically illustrating a measuring circuit for measuring the current-voltage characteristics for a transistor, and the needed clock signals with different duty cycles, according to the embodiment of the present invention.
Figure 3B:
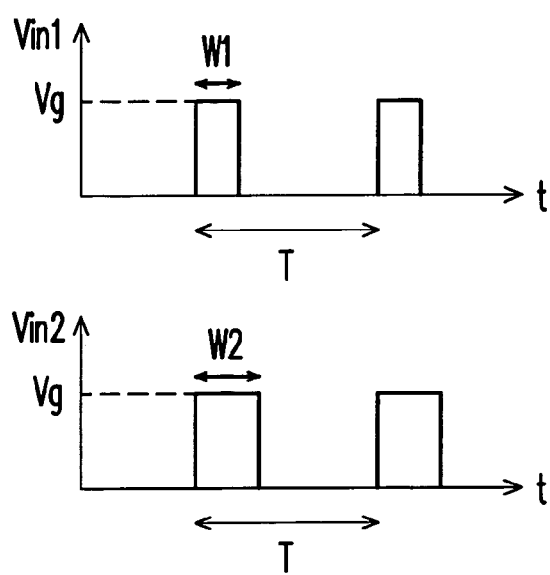

Following preferred embodiment, in which the measured device is an N-channel Metal Oxide Semiconductor (NMOS) transistor as an example, illustrates clearly the measuring method and circuit embodying the present invention. Any person who is familiar with ordinary electronic measurement can similarly apply into other kinds of transistor or electronic device. For example, the following embodiment can be applied to any device to be tested, which has a control terminal and at least one signal terminal. The signal terminal of the device to be tested is controlled according to the voltage level on the control terminal. FIG. 3A is the circuit diagram schematically illustrating a measuring circuit for measuring the current-voltage characteristics for a transistor, according to the preferred embodiment of the invention. FIG. 3b is a drawing, schematically illustrating the timing diagram for two the clock signals with different duty cycles, applied to the gate of transistor 301 in FIG. 3A. Vg is the voltage level of the clock signal at the high voltage level, that is, the gate voltage of the transistor 301 in FIG. 3A. W1 and W2 respectively represent the enabling time for the two clock signals, and T represents the clock period for the two clock signals.

Figure 4:
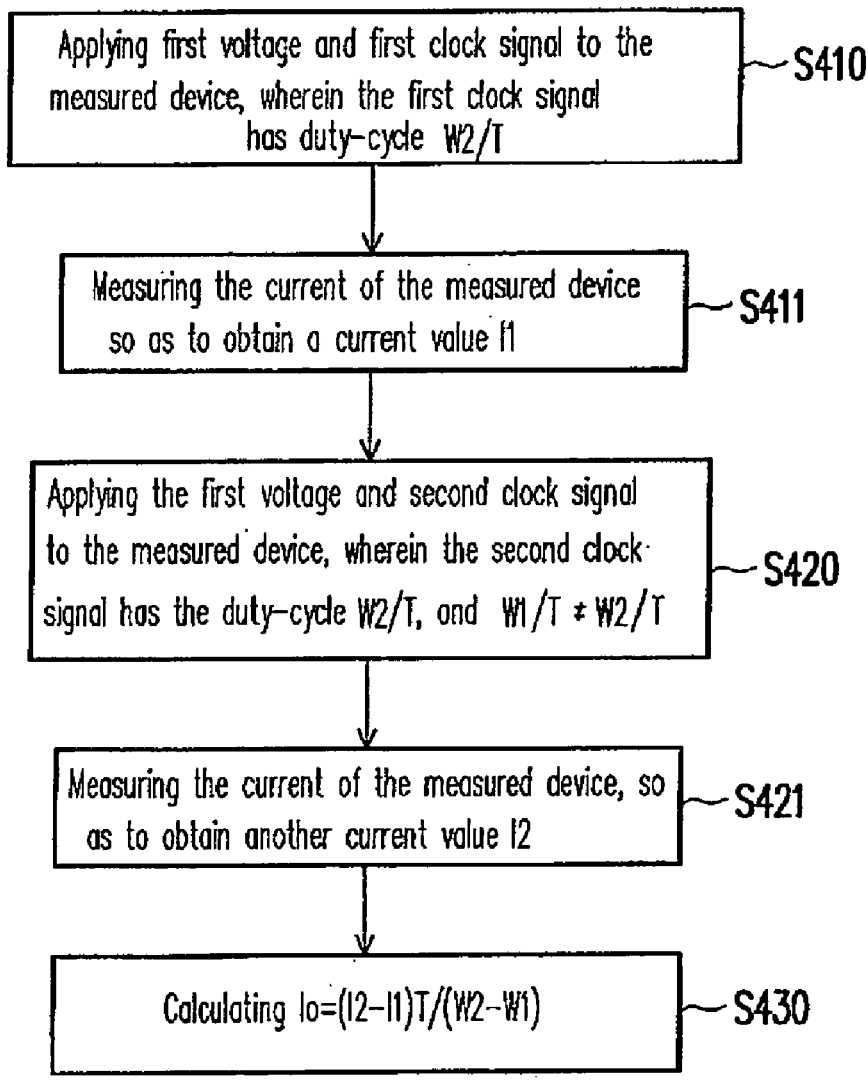
FIG. 4 is a drawing, schematically illustrating a flow-process diagram of measuring circuit for the current-voltage characteristics of transistor, according to the embodiment of the present invention.

FIG. 4 is a drawing, schematically illustrating a flow-process diagram of measuring circuit for the current-voltage characteristics of transistor, according to the embodiment of the present invention. Referring to FIGS. 3A, 3B and 4, in step S410, the voltage generator 310 provides a voltage applied to the drain of the transistor 301, that is, the signal terminal. The clock generator 320 provides a first clock signal Vin, of which the duty cycle is W1/T, to the gate of the transistor 301, that is, the control terminal. Then, a first current I1 is obtained by measuring the measured a drain current of the transistor 301 (Step S411). Then, the voltage generator 310 supplies a voltage to the drain of the transistor 301, the clock generator 320 supplies a second clock signal (of which the duty-cycle is W2/T, and W2/T≠W1/T) to the gate of transistor 301 (Step 420). Meanwhile, the transistor 301 is measured to obtain the second current value T2, that is, the drain current (Step S421).

Since I1=(W1/T)Io and I2=(W2/T)Io, wherein Io denotes the current value when applying a constant voltage Vg on the gate without self-heating effect, the two equations I1=W1/T)Io and I2=(W2/T)/Io can be solve in relation, so that the drain current Io=(I2−I1)T/(W2−W1) on the transistor without self-heating effect can be obtained when the transistor is applied with the first voltage at the drain and the constant voltage Vg at the gate (Step S430).

Figure 5:
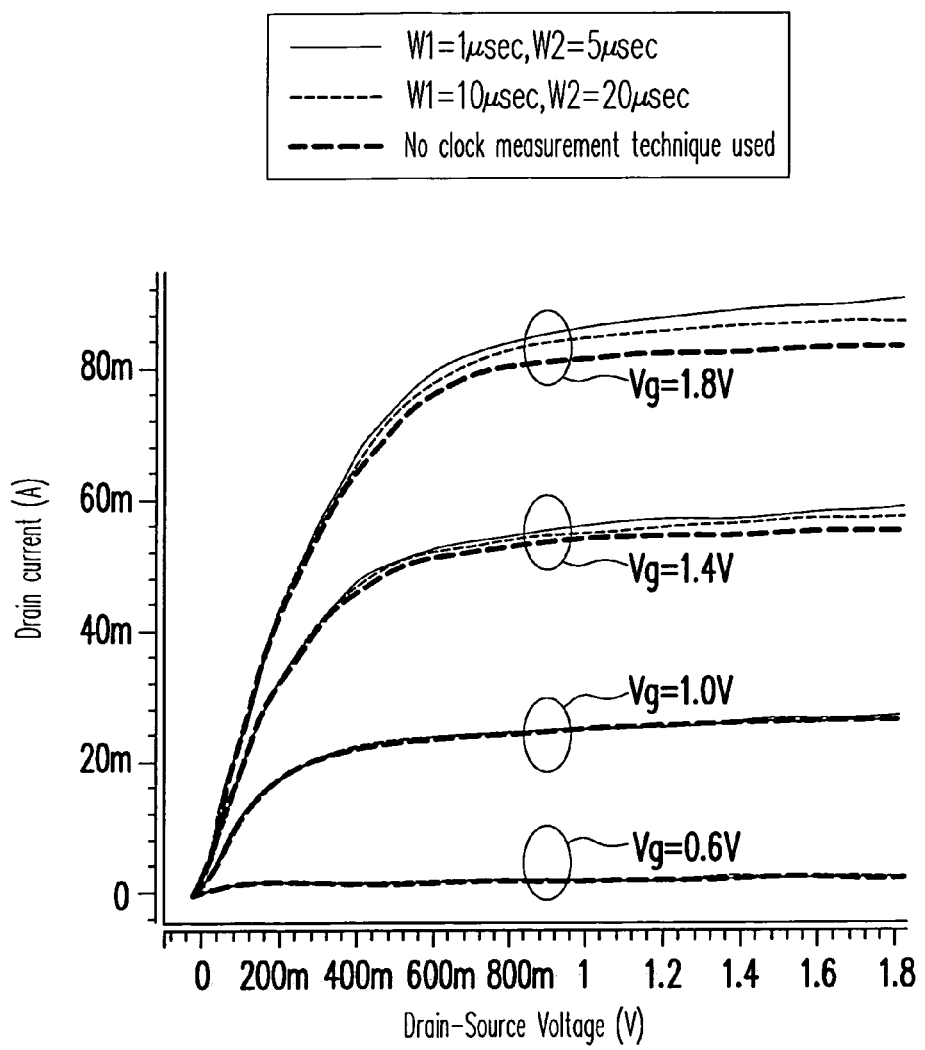
FIG. 5 is a drawing, schematically illustrating a simulated curve of the current-voltage characteristics of transistor, according to on the embodiment of the present invention.

FIG. 5 is a simulated result, of the current-voltage characteristics of the transistor, under various combination of different duty cycle for the circuit in FIG. 3. The simulated result shows that the higher the drain current is, the more obvious the reduction of the self-heating effect is. Moreover, the influence of self-heating effect can be reduced by mean of clock measurement technique. Particularly, when the enabling time period of the clock signal is shorter, the self-heating effect is more capably reduced.

In summary, the influence of the self-heating effect on the measured device can be reduced by using the clock signal and two clock signals with different duty cycles are used to respectively drive the measured device, to respectively obtain current of the measured device. Also and, the two current are used for calculating out the expected current. This method of the invention can increase measuring range of, the measured device.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A measuring method for current-voltage characteristic, suitable for use in measuring current-voltage characteristic of a measured device, comprising:
    applying a first voltage and a first clock signal to the measured device, wherein the first clock signal has a first duty-cycle;
    measuring the measured device to obtain a first current;
    applying the first voltage and a second clock signal to the measured device, wherein the second clock signal has a second duty-cycle, and the second duty-cycle is different from the first duty-cycle;
    measuring the measured device to obtain a second current; and
    obtaining an expected current on the measured device when the first voltage is applied to the measured device by calculation based on the first current, the second current value, the first duty-cycle and the second duty-cycle.

2. The method of claim 1, wherein when I1 represents the first current, I2 represents the second current, W1/T represents the first duty-cycle, and W2/T represents the second duty-cycle, the expected current is Io=(I2−I1)/(W2−W1), in which W1, W2, and T are real number.

3. The method of claim 1, wherein the measured device comprises a transistor device.

4. A measuring circuit for measuring current-voltage characteristic, suitable for use in measuring current-voltage characteristic of a measured device, the circuit comprising:
    a clock generator, coupled to the measured device, used to generate a first clock signal and a second clock signal at different time, for driving the measured device, wherein the first clock signal has a first duty-cycle, the second clock signal has a second duty-cycle, and the second duty-cycle is different from the first cycle; and a voltage generator, coupled to the measured device, used for setting and applying a first voltage to the measured device, wherein when the measured device is driven by the first clock signal, a first current is generated due to the first voltage and the first clock signal and when the measured device is driven by a second clock signal, the second current is generated due to the first voltage and a second clock signal, wherein an expected current of the measured device is obtained by calculation based on the first current, the second current, the first duty-cycle, the second duty-cycle.

5. The circuit of claim 4, wherein when I1 represents the first current, I2 represents the second current, W1/T represents the first duty-cycle, and W2/T represents the second duty-cycle, the expected current is Io=(I2−I1)/(W2−W1), in which W1, W2, and T are real number.

6. The circuit of claim 4, wherein the measured device comprises a transistor device.

7. A measuring method for current-voltage characteristic, suitable for use in measuring current-voltage characteristic of a measured device, the measured device having a control terminal and at least one signal terminal, and the signal terminal being controlled according to a voltage level at the control terminal, the measuring method comprising:

applying a firs voltage to the signal terminal;

measuring current at the signal terminal to be a first current value when a first clock signal with a first duty-cycle is applied to the control terminal;

measuring current at the signal terminal to be a second current value when a second clock signal with a second duty-cycle is applied to the control terminal; and performing calculation on the first current value, the second current value, the first duty-cycle, and the second duty-cycle, so as to obtain a measured current on the signal terminal.

8. The measuring method of claim 7, wherein when I1 represents the first current value, I2 represents the second current value, W1/T represents the first duty-cycle, and W2/T represents the second duty-cycle, then the measured current Io at the signal terminal is Io=(I2−I1)T/(W2−W1), wherein W1, W2, and T are real number.

9. The measuring method of claim 7, the measured device is a transistor device.

* * * * *